US011616493B2

(12) United States Patent
Semanson et al.

(10) Patent No.: US 11,616,493 B2
(45) Date of Patent: Mar. 28, 2023

(54) DEVICE AND METHOD FOR ENGAGING ACTUATION BASED ON RATE OF CHANGE OF PROXIMITY INPUT

(71) Applicant: Renesas Electronics America Inc., Milpitas, CA (US)

(72) Inventors: Christopher Semanson, Durham, NC (US); James Page, Hillsborough, NC (US); Onkar Raut, Sunnyvale, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 222 days.

(21) Appl. No.: 16/909,407

(22) Filed: Jun. 23, 2020

(65) Prior Publication Data

US 2020/0412343 A1 Dec. 31, 2020

Related U.S. Application Data

(60) Provisional application No. 62/867,827, filed on Jun. 27, 2019.

(51) Int. Cl.

| | |
|---|---|
| ***H03M 1/22*** | (2006.01) |
| ***H03H 17/06*** | (2006.01) |
| ***H03M 1/12*** | (2006.01) |

(52) U.S. Cl.

CPC .... *H03H 17/0685* (2013.01); *H03H 17/0628* (2013.01); *H03H 17/0664* (2013.01); *H03M 1/1245* (2013.01)

(58) Field of Classification Search

CPC . E03C 1/057; E03C 1/042; E03C 1/05; F16K 21/00; G06F 1/325; G06F 1/3203;

(Continued)

(56) References Cited

U.S. PATENT DOCUMENTS 3,968,482 A * 7/1976 Schuman ............... G08B 13/20 340/568.1
6,619,320 B2 * 9/2003 Parsons ..................... E03C 1/05 137/624.11

(Continued)

FOREIGN PATENT DOCUMENTS

CA 2638313 A1 * 1/2009 ............. F01C 1/126

*Primary Examiner* — Linh V Nguyen
(74) *Attorney, Agent, or Firm* — Foley & Larder LLP

(57) ABSTRACT

Various exemplary embodiments are directed to methods including obtaining an input sample magnitude, filtering the obtained input sample magnitude, generating a sample-to-sample difference based on the filtered input sample magnitude, and engaging an actuator in accordance with a determination that the sample-to-sample difference satisfies a rate threshold. In addition, various exemplary embodiments are directed to devices including a processor, a control sensor operatively coupled to the processor and operable to obtain an input sample magnitude, an input filter operatively coupled to the processor and operable to filter the at least one obtained input magnitude sample, a non-transitory computer-readable medium operatively coupled to the processor and including a rate engine operable to generate a sample-to-sample difference based on the filtered input sample magnitude, and to generate a determination that the sample-to-sample difference satisfies a rate threshold, and a control actuator operatively coupled to the processor and operable to engage an operation mechanism in accordance with the determination that the sample-to-sample difference satisfies a rate threshold.

18 Claims, 12 Drawing Sheets

(58) Field of Classification Search
CPC .... G06F 1/3231; G06F 1/3259; G06F 1/3271; G06F 2203/04107; G06F 3/0317; G06F 3/03547; G06F 3/041; G06F 3/0412; G06F 3/04166; G06F 3/0418; G06F 3/04182; G06F 3/04184; G06F 3/0443; G06F 3/0445; G06F 3/0446; Y10T 137/1842; Y10T 137/8376; F03B 13/00; F05B 2220/602; Y02B 10/50; H03M 1/1061; H03M 1/12; H03M 1/1215; H03M 1/468; H03M 1/661; H03M 1/68; H03M 1/76; H03M 1/804; H03M 3/34; H03M 3/424; H03M 3/458; H03K 2217/94026; H03K 2217/94031; H03K 17/945; H03K 17/962; H03K 17/955; H03K 2217/960705; H03K 17/941; H03K 2217/94108; H03H 17/0685; H03H 17/0621; H03H 17/0223; H03H 17/0275; H03H 17/0294; H03H 17/06; H03H 17/0664; H03H 2218/08; H03H 11/0427; H03H 15/02; H03H 17/0292; H03H 17/0227; H03H 17/0236; H03H 17/0248; H03H 17/0614; H03H 17/0628
USPC ........................................ 341/17, 20, 34, 35
See application file for complete search history.

(56) References Cited

U.S. PATENT DOCUMENTS

| | | | | |
|---|---|---|---|---|
| 7,069,941 | B2 * | 7/2006 | Parsons | F16K 31/402 251/30.03 |
| D624,630 | S * | 9/2010 | Matsuura | D23/255 |
| 7,921,480 | B2 * | 4/2011 | Parsons | E03C 1/057 250/221 |
| 7,960,623 | B1 * | 6/2011 | Cromley | A01H 5/10 800/298 |
| 9,695,579 | B2 * | 7/2017 | Herbert | E03C 1/057 |
| 9,976,291 | B2 * | 5/2018 | Sawaski | F21V 23/0471 |
| 2010/0188245 | A1 * | 7/2010 | Nielsen | G01V 3/15 340/686.1 |
| 2013/0341285 | A1 * | 12/2013 | Marion | C02F 1/008 210/85 |
| 2014/0174556 | A1 * | 6/2014 | Herbert | E03C 1/057 137/560 |
| 2015/0314058 | A1 * | 11/2015 | O'Mahony | G01B 7/003 417/63 |

* cited by examiner

DEVICE AND METHOD FOR ENGAGING ACTUATION BASED ON RATE OF CHANGE OF PROXIMITY INPUT

CROSS-REFERENCE TO RELATED PATENT APPLICATIONS

This application claims priority to U.S. Provisional Patent Application Ser. No. 62/867,827, entitled "Motional Touch Detection Algorithm for Proximity Applications," filed Jun. 27, 2019, the contents of such application being hereby incorporated by reference in its entirety and for all purposes as if completely and fully set forth herein.

TECHNICAL FIELD

The present embodiments relate generally to sensing technologies, and more particularly to engaging actuation based on rate of change of proximity input.

BACKGROUND

Capacitive touch sensing is used in a variety of proximity or motion sensing applications, such as conductive (metal) faucets that desire touchless interaction, and Human Machine Interfaces (HMI) that require a different action to be taken based on how an individual approaches the device (fast vs. slow). However, many challenges can be encountered in these and other applications.

SUMMARY

Various exemplary embodiments are directed to methods including obtaining an input sample magnitude, filtering the obtained input sample magnitude, generating a sample-to-sample difference based on the filtered input sample magnitude, and engaging an actuator in accordance with a determination that the sample-to-sample difference satisfies a rate threshold. In addition, various exemplary embodiments are directed to devices including a processor, a control sensor operatively coupled to the processor and operable to obtain an input sample magnitude, an input filter operatively coupled to the processor and operable to filter the at least one obtained input magnitude sample, a non-transitory computer-readable medium operatively coupled to the processor and including a rate engine operable to generate a sample-to-sample difference based on the filtered input sample magnitude, and to generate a determination that the sample-to-sample difference satisfies a rate threshold, and a control actuator operatively coupled to the processor and operable to engage an operation mechanism in accordance with the determination that the sample-to-sample difference satisfies a rate threshold.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present embodiments provide a capacitive touch solution implementable in firmware and tolerant to running water in the presence of a human body interacting with a metal structure, or other similar environmental interference factors. In addition, embodiments are accurate from a greater distance as compared to conventional embodiments. Thresholds of embodiments in accordance with the present embodiments need not be artificially high to mitigate interference from running water. According to certain additional aspects, embodiments can reduce required hardware and save money over conventional embodiments, which may utilize more than one type of technology to determine human interaction, such as infrared or time to flight sensors, in addition to capacitive sensing.

Figure 1:
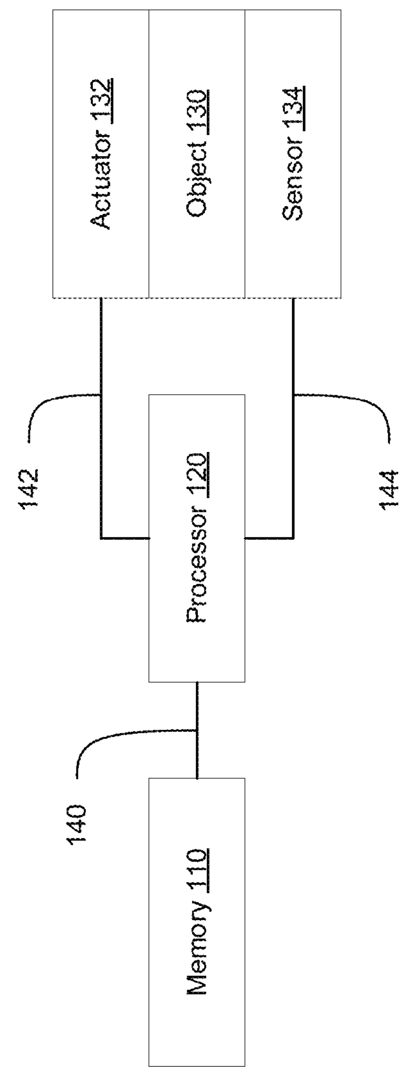
FIG. 1 illustrates an exemplary system in accordance with present embodiments.

FIG. 1 illustrates an exemplary system in accordance with present embodiments.

As illustrated in FIG. 1, exemplary system 100 includes a memory 110, a processor 120, an actuator 132, an object 130 and a sensor 134. The exemplary system 100 also includes a memory communication path 140, an actuator communication path 142, and a sensor communication path 144.

The memory 110 may comprise one or more of any non-transitory computer-readable medium or media as are known or may become known. The memory 110 in accordance with present embodiments may comprise a rewritable or write-once memory such as a ROM, flash, WORM, embedded memory, optical media, magnetic platter media, solid state memory, or the like. The processor 120 may comprise one or more of any computer processors as are known or may become known. In some embodiments, the processor 120 is an embedded processor including instructions, structure, programming, hardware components, or the like to support operation in accordance with present embodiments. The processor may include one or more of, but is not limited to, any integrated circuit (IC), an ASIC, a PGA, an FPGA, an embedded controller, or the like. The memory communication path 140 operatively couples the memory 110 to the processor 120, either directly or indirectly through intervening structures. The memory communication path 140 may also operatively couple the processor 120 with a wired or wireless interface as is known or may become known, including but not limited to communication buses, active wireless receivers, and passive wireless receivers.

The object 130 may comprise a physical or mechanical device with one or more mechanical controls. In some embodiments, the object 130 comprises a water faucet, fluid-containing pipe, or the like, and further comprises a mechanical operation mechanism. In some embodiments, a mechanical operation mechanism may comprise a valve, lever, handle, knob, or the like. In some embodiments, the object 130 is operatively coupled to the actuator 132 through a mechanical operation mechanism of the object 130. The object 130 may partially or completely house the actuator. In some embodiments, the actuator 130 includes a solenoid, an AC motor, or the like. The actuator communication path 142 operatively couples the actuator 132 to the processor 120, either directly or indirectly through intervening structures. The actuator communication path 142 may also operatively couple the actuator 132 to the processor 120 with a wired or wireless interface as is known or may become known, including but not limited to communication buses, active wireless receivers, and passive wireless receivers.

The sensor 134 may comprise a capacitive sensor, an infrared sensor, a visual sensor, or the like. In some embodiments, the sensor 134 is operatively coupled to the object 130. In some embodiments, the object 130 is operatively coupled as an antenna to the sensor 134. The sensor communication path 144 operatively couples the sensor 134 to the processor 120, either directly or indirectly through intervening structures. The sensor communication path 144 may also operatively couple the sensor 134 to the processor 120 with a wired or wireless interface as is known or may become known, including but not limited to communication buses, active wireless receivers, and passive wireless receivers.

Figure 2:
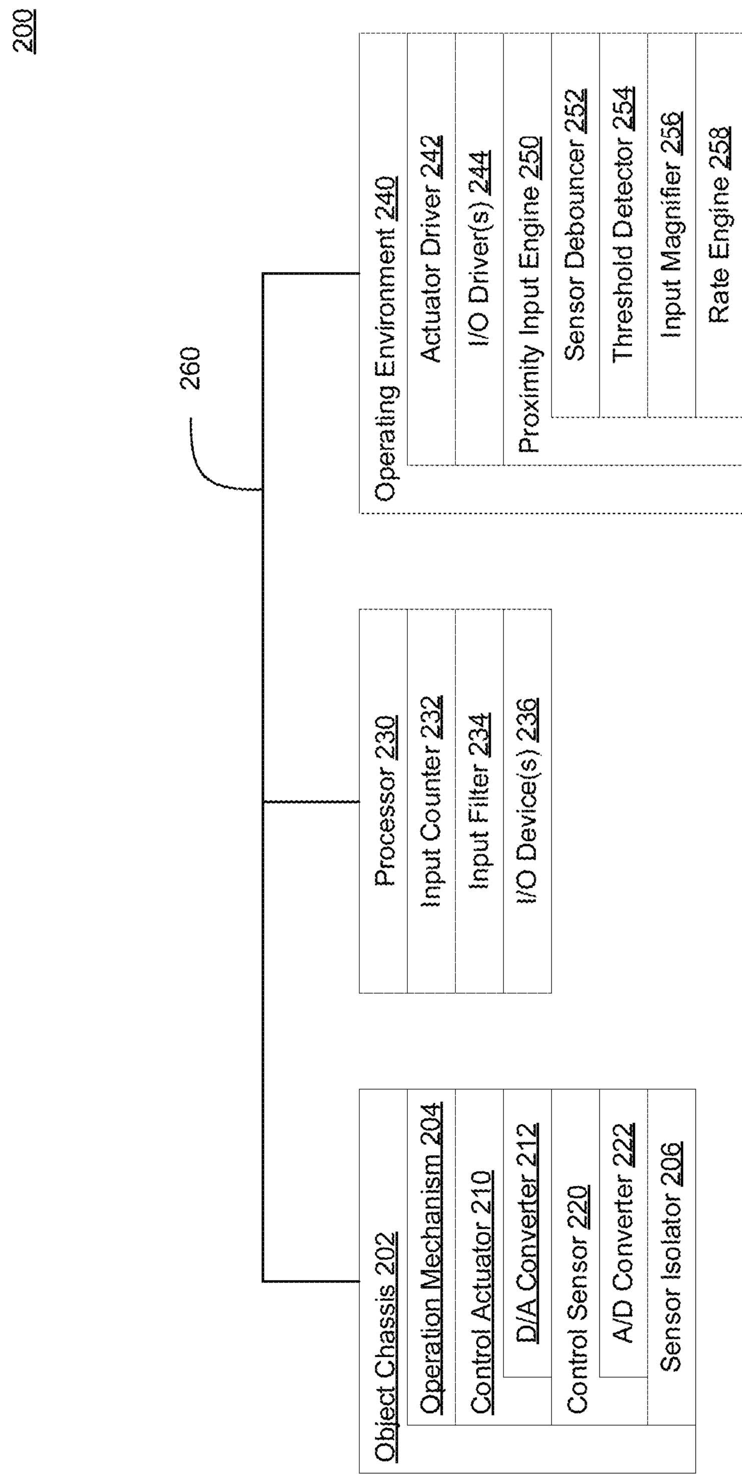
FIG. 2 illustrates an exemplary device in accordance with present embodiments.

FIG. 2 illustrates an exemplary device in accordance with present embodiments.

Exemplary system 200 includes an object chassis 202, a processor 230, an input counter 232, an input filter 234, an I/O device 236, an operating environment 240, and a communication path 260.

The object chassis may comprise an exterior, a frame, a structure, or the like. The object chassis may be constructed from material including one or more elemental, compound, or alloyed metals and nonmetals. In some embodiments, the object chassis 202 includes a water faucet, water fountain, fluid pipe, or the like, and is operable to selectively allow fluid including, but not limited to, water or the like to pass therethrough. The object chassis 202 further includes an operation mechanism 204, a control actuator 210, a control sensor 220, and a sensor isolator 206.

The operation mechanism 204 may comprise a mechanical structure for modifying or controlling an aspect of operation of the object chassis. In some embodiments, the operation mechanism 204 is a valve, lever, handle, knob, or the like. In some embodiments, the operation mechanism 204 includes a handle or level for controllably and variably allowing and blocking a flow or transmission of water through the object chassis 202. The object chassis is, in some embodiments, at least partially integrated with or coupled to the operation mechanism 204, one or more mechanical devices, elements, systems, or the like.

The control actuator 210 may comprise a mechanical structure for controlling or changing a state of the operation mechanism 204. In some embodiments, the control actuator is a solenoid or an AC motor mechanically coupled to the valve, lever, handle, knob, or the like comprising the operation mechanism 204. The control actuator 210 further includes a digital-to-analog converter 212. The digital-to-analog ("D/A") converter 212 is operable to convert a digital control signal received from the processor 230 or the I/O device 236 into an analog signal to drive the control actuator 210. In some embodiments, the D/A converter 212 is partially or completely integrated with the control actuator 210. In some embodiments, the D/A converter is operatively coupled to the processor 230 through the communication path 260 and the I/O device 236.

The control sensor 220 may comprise a mechanical, electromechanical, electrical, electronic, or like structure for sensing proximity input or touch input. In some embodiments, the control sensor 220 includes a capacitive device, component, or the like operable to detect a change in an electrical field proximate to the object chassis 202. In some embodiments, a change in an electrical field is caused by a human hand, finger, limb, or the like moving or placed proximate to the object chassis 202 or the control sensor 220. The control sensor further includes an analog-to-digital converter 222. The analog-to-digital ("A/D") converter 222 is operable to convert an analog signal proximity input signal received from the control sensor 220 into a digital signal to the I/O device 236 or a plurality thereof. In some embodiments, the A/D converter 222 is partially or completely integrated with the control sensor 220. In some embodiments, the A/D converter is operatively coupled to the processor 230 through the communication path 260 and the I/O device 236.

The sensor isolator 206 may comprise an electrical insulator for electrically isolating the object chassis 202 from an external base or mounting surface. In some embodiments, the sensor isolator includes a rubber or like substance and is disposed between the object chassis 202 and an external base on which the object chassis is mounted, coupled, integrated, attached or the like. On some embodiments, the object chassis 202 is electrically isolated from an external base to maintain electrical sensitivity of the object chassis 202 to capacitive proximity input.

The processor 230 may comprise any processor in accordance with processor 120. In some embodiments, the processor 230 is partially or completely integrated with one or more of the input filter 232, the input counter 234 and the I/O device or devices 236 as an integrated circuit ("IC"), system-on-chip ("Sort"), or the like. In some embodiments, alternatively, the processor 230 is operatively coupled with one or more of the input filter 232, the input counter 234 and the I/O device or devices 236 through communication path 260 or an alternative communication path reserved to the processor 230.

The input counter 232 may comprise an electrical or electromechanical device for counting a number of occurrences of proximity input. In some embodiments, the input counter 232 comprises a hardware device or logic partially or completely integrated with processor 230. In some embodiments, the input counter comprises a synchronous, asynchronous, digital, analog, or like counter. It is to be understood that the input counter 232 may be implemented as illustrated as a dedicated hardware or firmware component, including, but not limited to, being partially or completely implemented as a programmable or reprogrammable semiconductor device.

Alternatively, the input counter 232 may be partially or completely implemented as a programmable logic block within non-transitory memory 110.

The input filter 234 may comprise an electrical device for removing sensed input not associated with potential proximity input. In some embodiments, the input filter 234 may comprise a moving average filter. An exemplary input filter 234 filter utilizes a tunable length moving average filter in order to smooth out an erroneous high rate of change that may be introduced in the differential measurement. In some embodiments, the input filter 234 is an integrated circuit, hardware logical block integrated with the processor 230, or the like. In some embodiments, the input filter 234 is operatively coupled at least to the I/O device or devices 236 and the processor 230. In some embodiments, the input filter 234 receives a digitized proximity input signal from the I/O device or devices, and transmits a filtered digitized proximity input signal to the processor 230. Alternatively, the input filter 234 may receive the digitized proximity input signal from the processor 230, and may transmit the filtered digitized proximity input signal back to the processor 230. It is to be understood that communication between the input filter 234 and the processor 230 or the I/O device or devices 236 is not limited to above examples, and that these components may communicate directly or indirectly as is known or may become known. It is to be understood that the input filter 234 may be implemented as illustrated as a dedicated hardware or firmware component, including, but not limited to, being partially or completely implemented as a programmable or reprogrammable semiconductor device. Alternatively, the input filter 234 may be partially or completely implemented as a programmable logic block within non-transitory memory 110.

The I/O device or devices 236 may comprise any communication hardware, interfaces, transceivers or the like for input or output. In some embodiments, the I/O device or devices include, but are not limited to, serial input and output, wireless or the like.

The operating environment 240 may comprise any hardware and program management system, as is known or may become known, embodied on a non-transitory computer-readable medium as is known or may become known. In some embodiments, the operating environment 240 is stored in memory 110. In some embodiments, the operating environment 240 is a high level operating system, an embedded operating system, or a boot loader. In some embodiments, the operating environment 240 includes an application programming interface (API). An exemplary API sits at the top of the hardware processing layer and can be encapsulated into an API such that a user is only alerted to events that satisfy one or more thresholds set to notify the processor 230 or an application of a button press. Another exemplary operating environment may encapsulate the API. An encapsulated API has the benefit of being modular, and allowing control logic to be ported from system to system and processor to processor without refactoring. In some embodiments, the operating environment 240 includes one or more instructions operable specifically with or only with processor 230. The operating environment 240 further includes an actuator driver 242, an I/O driver 242, and a proximity input engine 250.

The actuator driver 242 may comprise a device driver, as is known or may become known, for operating the control actuator 210. In some embodiments, the actuator drivers includes instructions for interfacing with the control actuator through the D/A converter 212. In some embodiments, the actuator driver includes instructions for operating the actuator to activate or deactivate the operation mechanism 204.

The I/O driver or drivers 244 may comprise one or more device drivers, as are known or may become known, for operating one or more input and output devices operatively coupled to the processor 230. In some embodiments, one I/O driver controls one I/O device of a plurality that is operatively coupled to the D/A converter 212, and another I/O driver controls another I/O device of the plurality that is operatively coupled to the A/D converter 222. In some embodiments, the I/O driver or drivers 244 include instructions for controlling and interfacing with the input counter 232 and the input filter 234.

The proximity input engine 250 may comprise one or more instructions for operating the controlling operation of the operation mechanism based on proximity input detected from the control sensor 220. In some embodiments, the proximity input engine include logic to control all input detection, input analysis, and control output for system 200. The proximity input engine 250 further includes a sensor debouncer 252, a threshold detector 254, an input magnifier 256, and a rate engine 258.

The sensor debouncer 252 may comprise one or more instructions for applying a delay to an operation instruction or delaying an operation instruction. In some embodiments, the sensor debouncer is operable to initiate a "latch on" debounce. An exemplary latch on debounce is a time debounce that delays actuation of a proximity input event. In some embodiments, the sensor debouncer is operable to initiate a "latch off" debounce. An exemplary latch off debounce is a time debounce that delays removal of a proximity input event.

The threshold detector 254 may comprise one or more instructions for determining, detecting and identifying a proximity input. In some embodiments, the threshold detector 254 is operable to determine, detect and identify a "latch on" point. An exemplary latch on point is a threshold at which the rate of increase has crossed a specific threshold indicating a human body is approaching the conductive metal structure within a preferred or predetermined proximity. In some embodiments, a latch on point may have a positive magnitude. In some embodiments, the threshold detector is operable to determine, detect and identify a "latch off" point. An exemplary latch off point is a threshold at which the rate of decrease has crossed a specific threshold indicating a human body departing the conductive metal structure. In some embodiments, a latch off point may have a negative magnitude. The threshold detector 254 may include static or modifiable latch on and latch off points at thresholds independent of each other, in order to provide more control and variability over speed at which a proximity input approaches and moves away from the object chassis 202. In some embodiments, the threshold detector 254 includes different thresholds which trigger different actions based on the speed of movement around the metal structure being sensed.

The input magnifier 256 may comprise one or more instructions for amplifying differences between input magnitudes, in order to accommodate proximity input with varying levels of granularity or sensitivity. As one example, the input magnifier 256 magnifies proximity input with an input range entirely below minimum magnitude of a positive or negative threshold. In some embodiments, the input magnifier 256 is operable to include a static or modifiable magnification factor. An exemplary magnification factor allows the user to exaggerate the sample-to-sample touch difference, to, for example, mitigate sensitivity issues in touch-to-touch measurement.

The rate engine 258 may comprise one or more instructions for determining a rate of change in proximity input. In some embodiments, the rate engine 258 comprises a differentiator or differentiation logic. In some embodiments, the rate engine 258 receives a plurality of proximity input magnitude samples, and outputs the first derivative of the received plurality of input magnitude samples representing a rate of change of magnitude of proximity input over time.

The communication path 260 may comprise one or more wired or wireless channels for unidirectional or bidirectional communication within exemplary system 200. In some embodiments, the communication path 260 includes one or more of the memory communication path 140, the processor communication path 142, and the sensor communication path 144. In some embodiments, the communication path 260 includes at least one digital bus.

FIGS. 3A-3F illustrate exemplary embodiments according to exemplary systems 100 and 200. Exemplary embodiments 300A-F include an object chassis 310A-F, a control unit 320A-F, a sensor isolator 340 and a base 330. The exemplary embodiments 300A-F are operable to detect the presence or absence of proximity inputs 350A-F. The object chassis 310A-F may comprise any structure formed of any material or materials permitting transmittance of an electrostatic field. In some embodiments, the object chassis 310A-F includes a metallic water faucet and at least one water valve operable to start and stop flow of water through the water faucet. The control unit 320A-F may comprise at least one electronic device or system for starting, stopping, and controlling the flow of water through the object chassis 310A-F. In some embodiments, the control unit 320A-F comprises at least one of an embedded controller, a system-on-chip, a microcontroller, and a programmable controller, or the like.

The base 330 comprises any solid surface with which the control unit 310A-F is coupled, mounted, attached, integrated, or the like. In some embodiments, the base 330 comprises a countertop, tabletop, or the like. The sensor isolator 340 may comprise any structure or object in accordance with the sensor isolator 206, for electrically isolating the object chassis 310A-F from the base 330. The sensor isolate 340 allows the proximity input to detect electrostatic background through the object chassis 310A-F and prevents detection of electrostatic background or proximity input from the base 330.

Figure 3A:
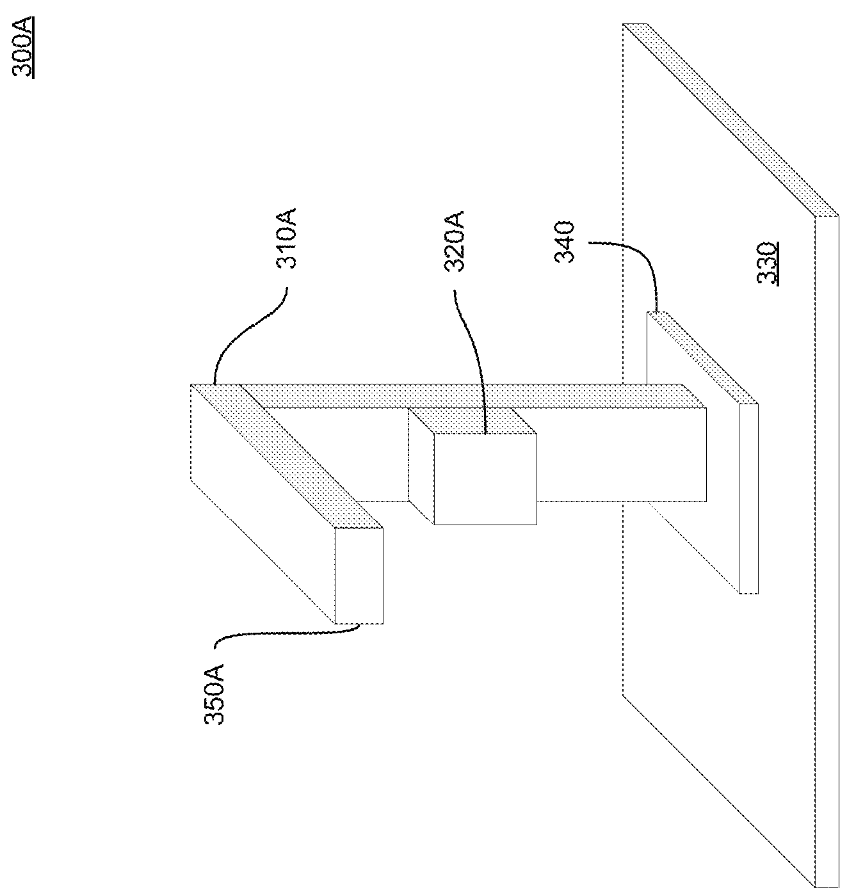
FIG. 3A illustrates an exemplary device in an exemplary deactivated state without the presence of interference and without the presence of proximity input.

FIG. 3A illustrates an exemplary device in an exemplary deactivated state without the presence of interference and without the presence of proximity input. In exemplary state 300A, the object chassis 310A includes undetectable fluid interference and the control unit 320A detects proximity input 350A insufficient to meet a proximity input threshold. In state 300A, only a minimal, residual, or trace amount of water may be present in the water faucet of the object chassis 310A. The proximity input 350A comprises only electrostatic background. The exemplary state 300A may correspond to exemplary timing states 402-404 of FIG. 4, 502-504 of FIG. 5, and 602-604 of FIG. 6.

Figure 3B:
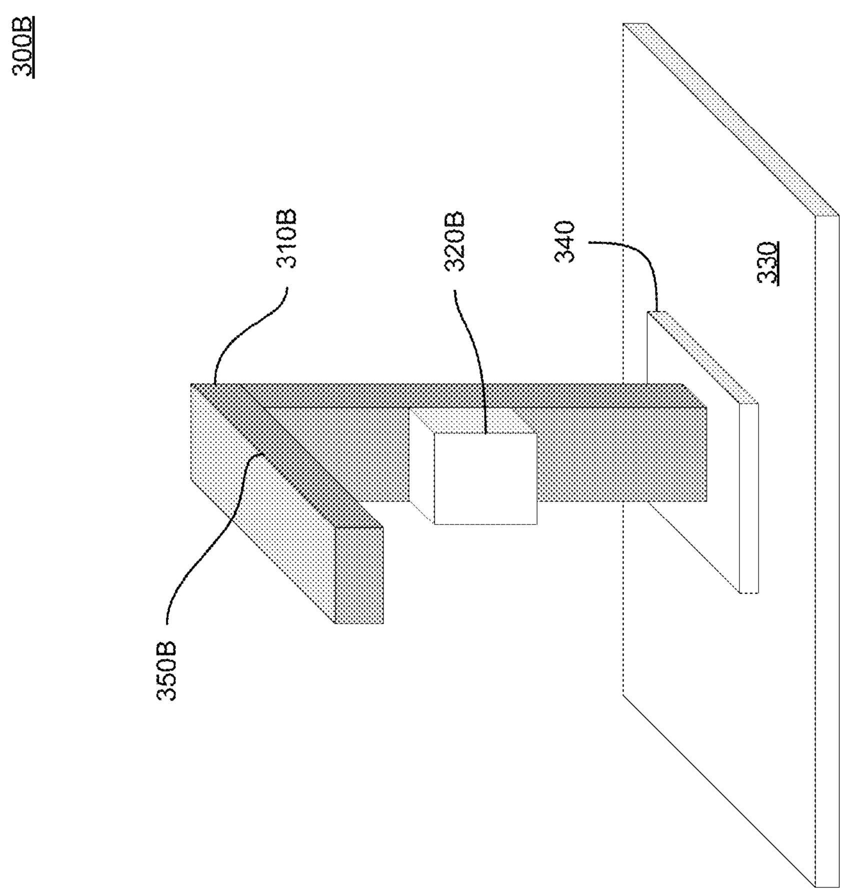
FIG. 3B illustrates an exemplary device in an exemplary deactivated state with the presence of low interference and without the presence of proximity input.

FIG. 3B illustrates an exemplary device in an exemplary deactivated state with the presence of low interference and without the presence of proximity input. In exemplary state 300B, the object chassis 310B includes detectable fluid interference and the control unit 320A detects proximity input 350B insufficient to meet a proximity input threshold. In state 300B, a significant amount of flowing or still water may be present in the water faucet of the object chassis 310B. The proximity input 350B comprises an electrostatic field with a state corresponding to the presence of a detectable amount of fluid interference from flowing or still water, with a rate of change magnitude greater than proximity input 350A, but less than any proximity input threshold. The exemplary state 300B may correspond to exemplary timing states 404-410 of FIG. 4, 504-581 of FIG. 5, and 604-616 of FIG. 6.

Figure 3C:
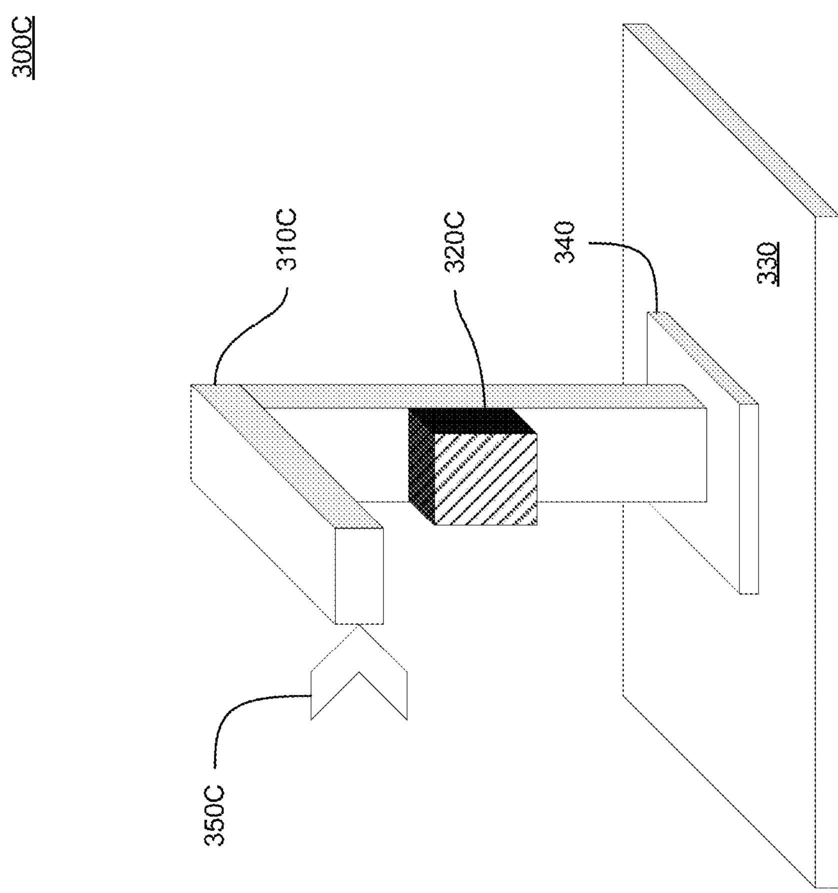
FIG. 3C illustrates an exemplary device in an exemplary deactivated state without the presence of interference and with the presence of activation proximity input.

FIG. 3C illustrates an exemplary device in an exemplary deactivated state without the presence of interference and with the presence of activation proximity input. In exemplary state 300C, the object chassis 310C includes undetectable fluid interference and the control unit 320C detects proximity input 350C sufficient to meet a proximity input threshold. In state 300C, only a minimal, residual, or trace amount of water may be present in the water faucet of the object chassis 310C. The proximity input 350C comprises an electrostatic field with a state corresponding to the presence of a detectable proximity input from a human hand, finger, appendage, limb, or the like, with a rate of change magnitude greater than proximity input 350A, proximity input 350B, and a proximity input threshold. The exemplary state 300C may correspond to exemplary timing states 412-418 of FIG. 4, and 520-526 of FIG. 5.

Figure 3D:
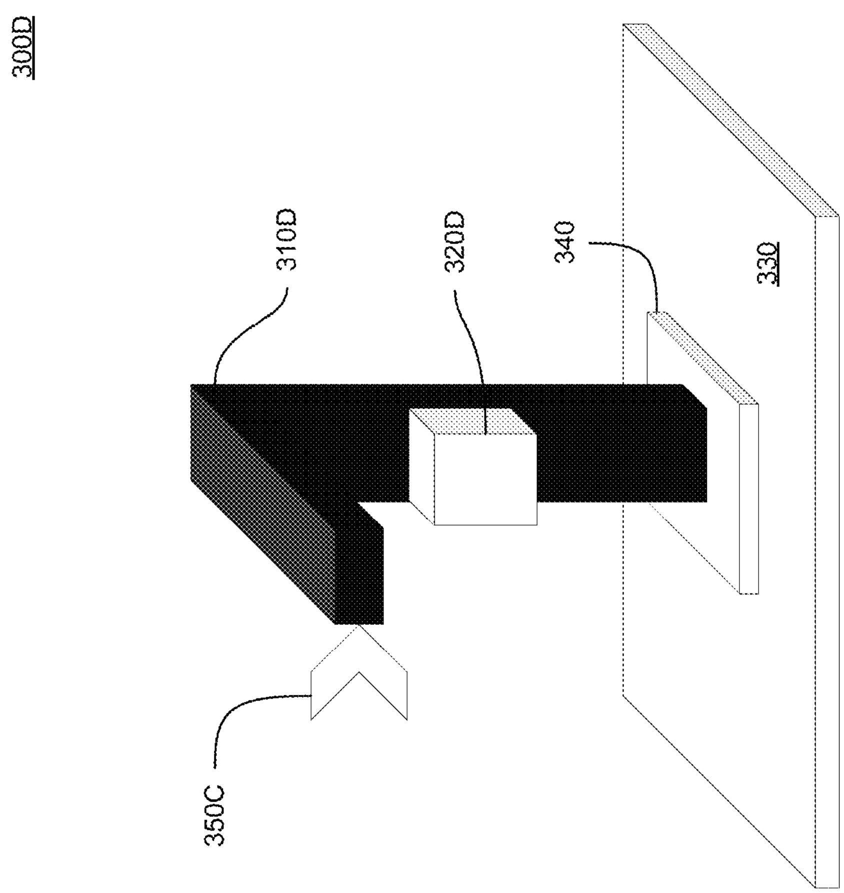
FIG. 3D illustrates an exemplary device in an exemplary activated state subsequent to the exemplary state of FIG. 3C, with the presence of high interference and with the presence of activation proximity input.

FIG. 3D illustrates an exemplary device in an exemplary activated state subsequent to the exemplary state of FIG. 3C, with the presence of high interference and with the presence of activation proximity input. In exemplary state 300D, the object chassis 310D includes detectable fluid interference, the control unit 320D continues to detect proximity input 350C sufficient to meet a proximity input threshold, and the control unit actuates an operation mechanism of the object chassis to activate a flow of water through the water faucet of the object chassis 300D. The control unit 300D may actuate the operation mechanism after a debouncing delay, in a transition from state 300C to state 300D. In state 300D, flowing water in an amount corresponding to an "on" state may be present in the water faucet of the object chassis 310D. The proximity input 350D comprises an electrostatic field with a state corresponding to the presence of a detectable proximity input from a human hand, finger, appendage, limb, or the like, with a rate of change magnitude greater than proximity input 350A, proximity input 350B, and a proximity input threshold. The exemplary state 300D may correspond to exemplary timing states 420-422 of FIG. 4.

Figure 3E:
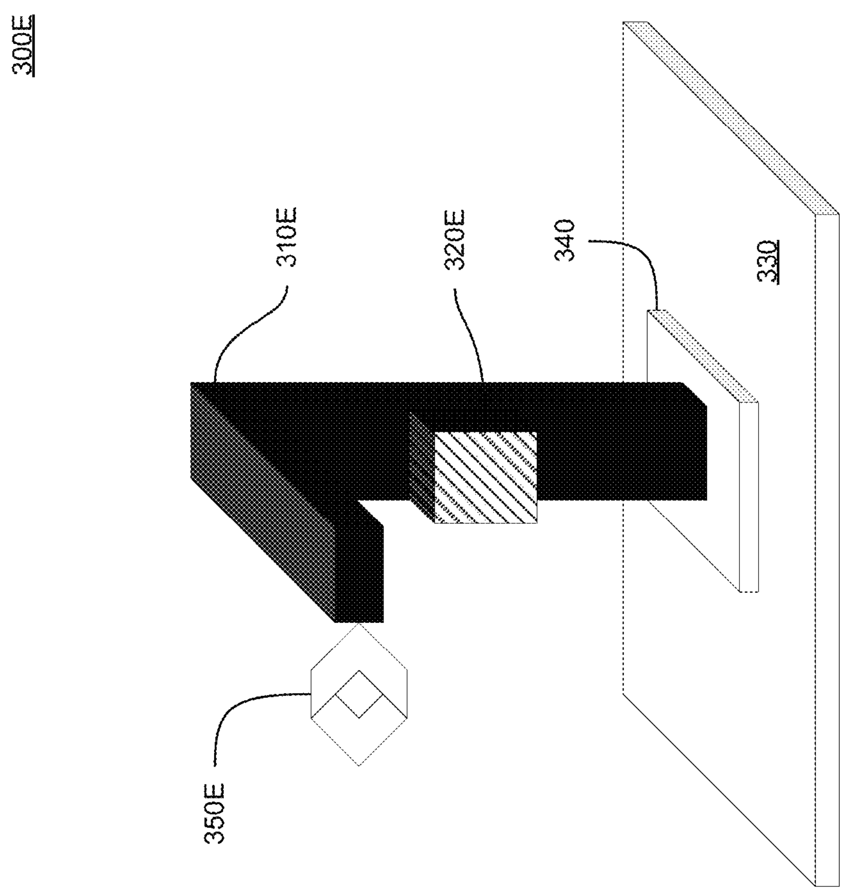
FIG. 3E illustrates an exemplary device in an exemplary activated state with the presence of high interference and with the presence of deactivation proximity input.

FIG. 3E illustrates an exemplary device in an exemplary activated state with the presence of high interference and with the presence of deactivation proximity input. In exemplary state 300E, the object chassis 310E includes detectable fluid interference and the control unit 320E detects proximity input 350E sufficient to meet a proximity input threshold. In state 300E, flowing water in an amount corresponding to an "on" state may be present in the water faucet of the object chassis 310E. The proximity input 350E comprises an electrostatic field with a state corresponding to the presence of a detectable proximity input from a human hand, finger, appendage, limb, or the like, with a rate of change magnitude greater than proximity input 350A, proximity input 350B, and a proximity input threshold. In some embodiments, the proximity input 350E corresponds to a human proximity change toward the object chassis 310E or a human proximity change moving away from the object chassis 310E. The exemplary state 300E may correspond to exemplary timing states 616-622 of FIG. 6.

Figure 3F:
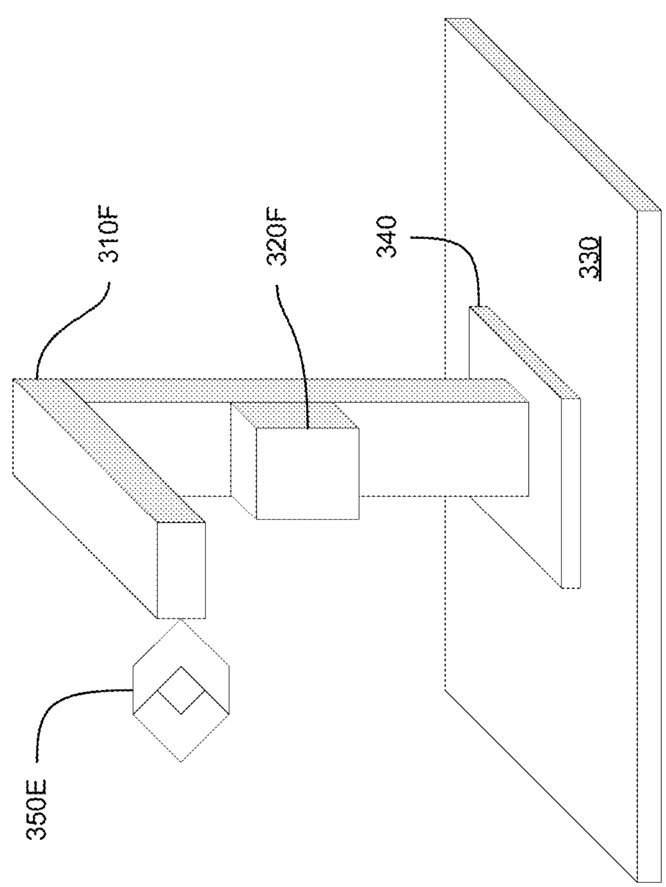
FIG. 3F illustrates an exemplary device in an exemplary deactivated state subsequent to the exemplary state of FIG. 3E, without the presence of interference and with the presence of deactivation proximity input.

FIG. 3F illustrates an exemplary device in an exemplary deactivated state subsequent to the exemplary state of FIG. 3E, without the presence of interference and with the presence of deactivation proximity input. In exemplary state 300F, the object chassis 310F includes undetectable fluid interference, the control unit 320F continues to detect proximity input 350E sufficient to meet a proximity input threshold, and the control unit actuates an operation mechanism of the object chassis to deactivate a flow of water through the water faucet of the object chassis 300F. In state 300F, flowing water in an amount corresponding to an "on" state may be stopped in the water faucet of the object chassis 310F. As one example, a control unit may operate in a "constant on" mode to turn on a water faucet when a hand approaches the water faucet, and may turn off the water faucet when the hand again approaches the water faucet. As another example, a control unit may operate in a "temporary on" mode to turn on a water faucet when a hand approaches the water faucet, and may turn off the water faucet when the hand again moves away from the water faucet. This way, a faucet may only be "on" when a hand is proximate to a water faucet. The exemplary state 300F may correspond to exemplary timing states 622-626 of FIG. 6.

Figure 4:
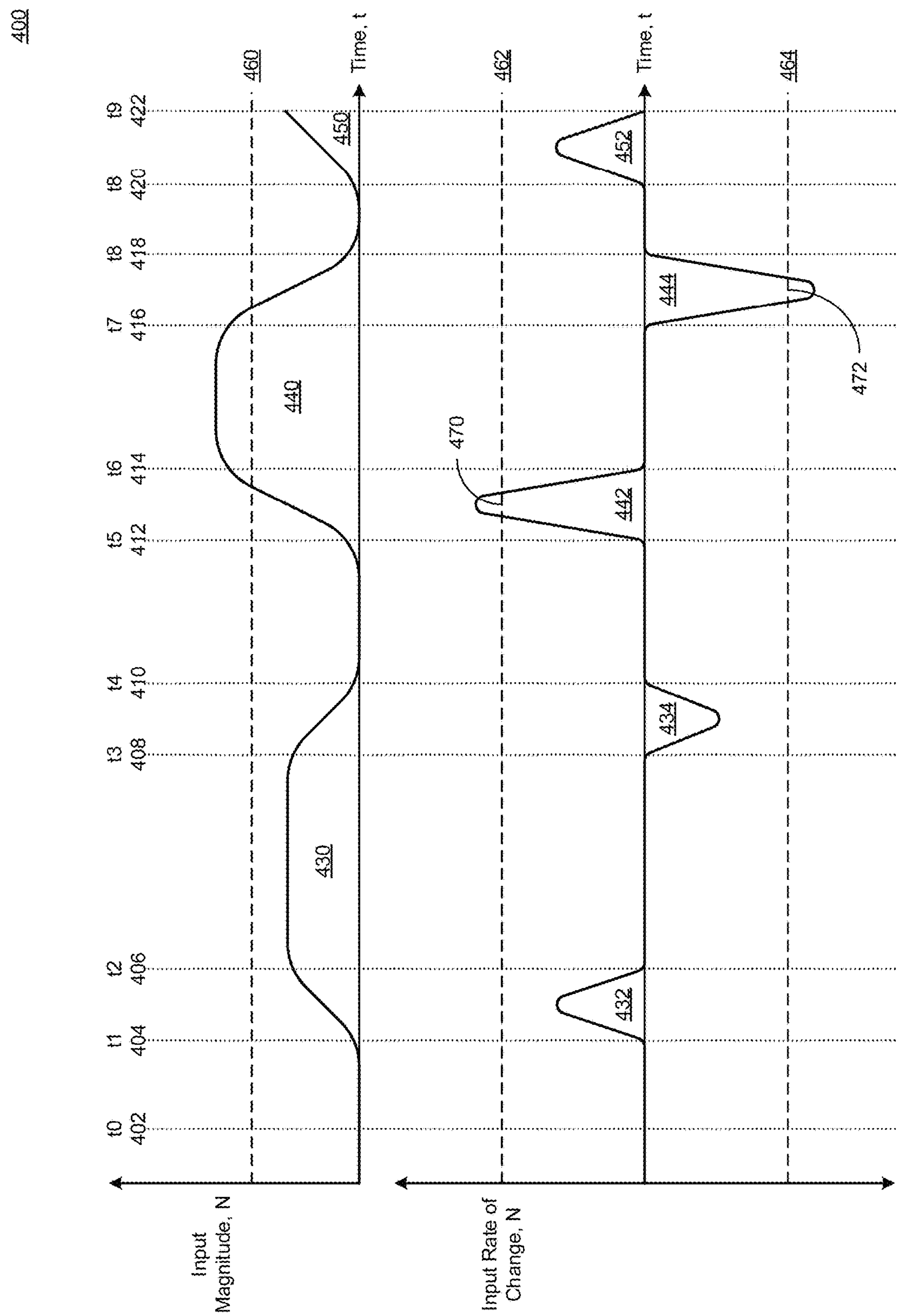
FIG. 4 illustrates exemplary timing diagrams including isolated interference and isolated proximity input detection.
Figure 5:
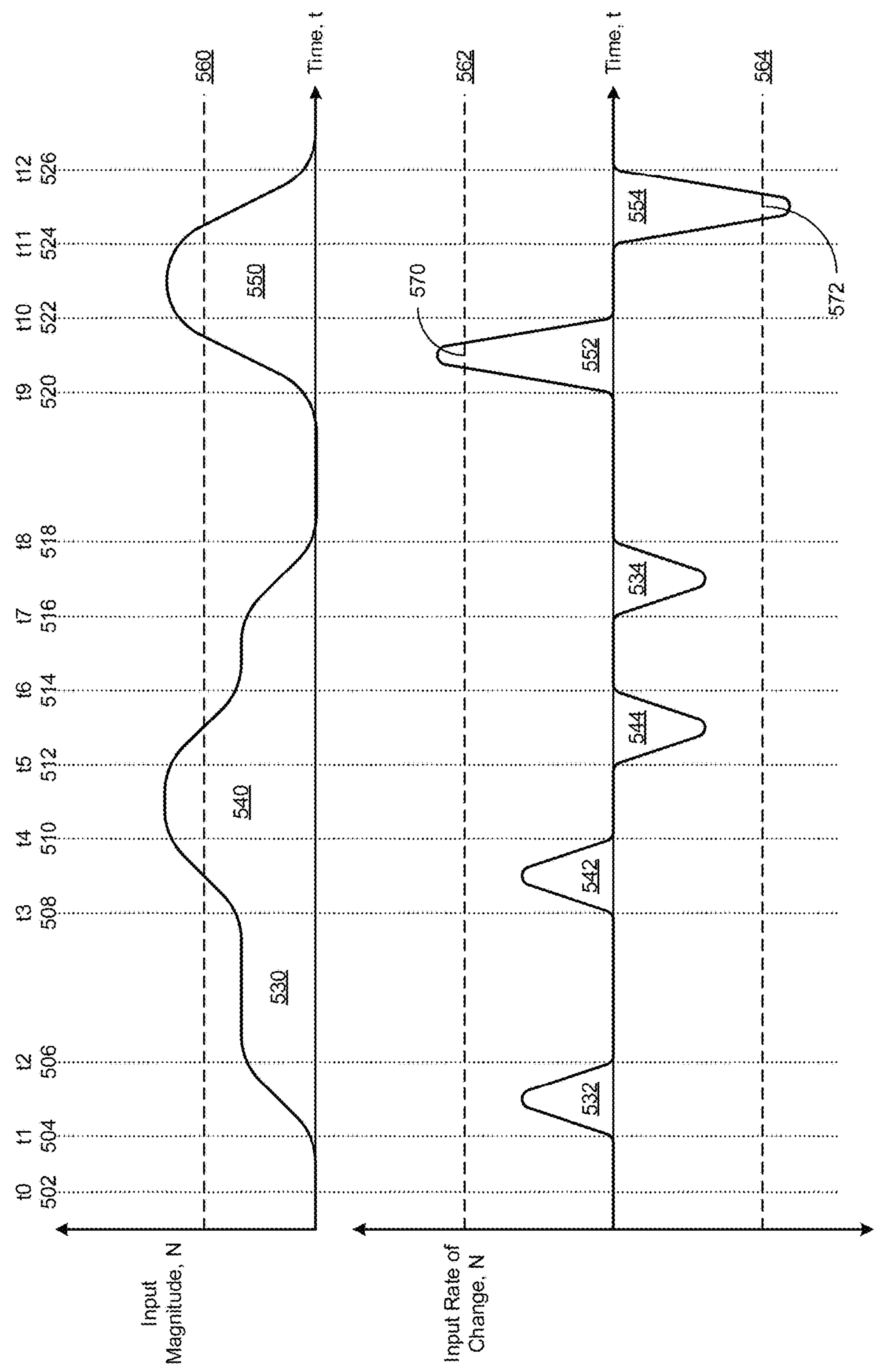
FIG. 5 illustrates exemplary timing diagrams including compounding interferences and isolated proximity input detection.
Figure 6:
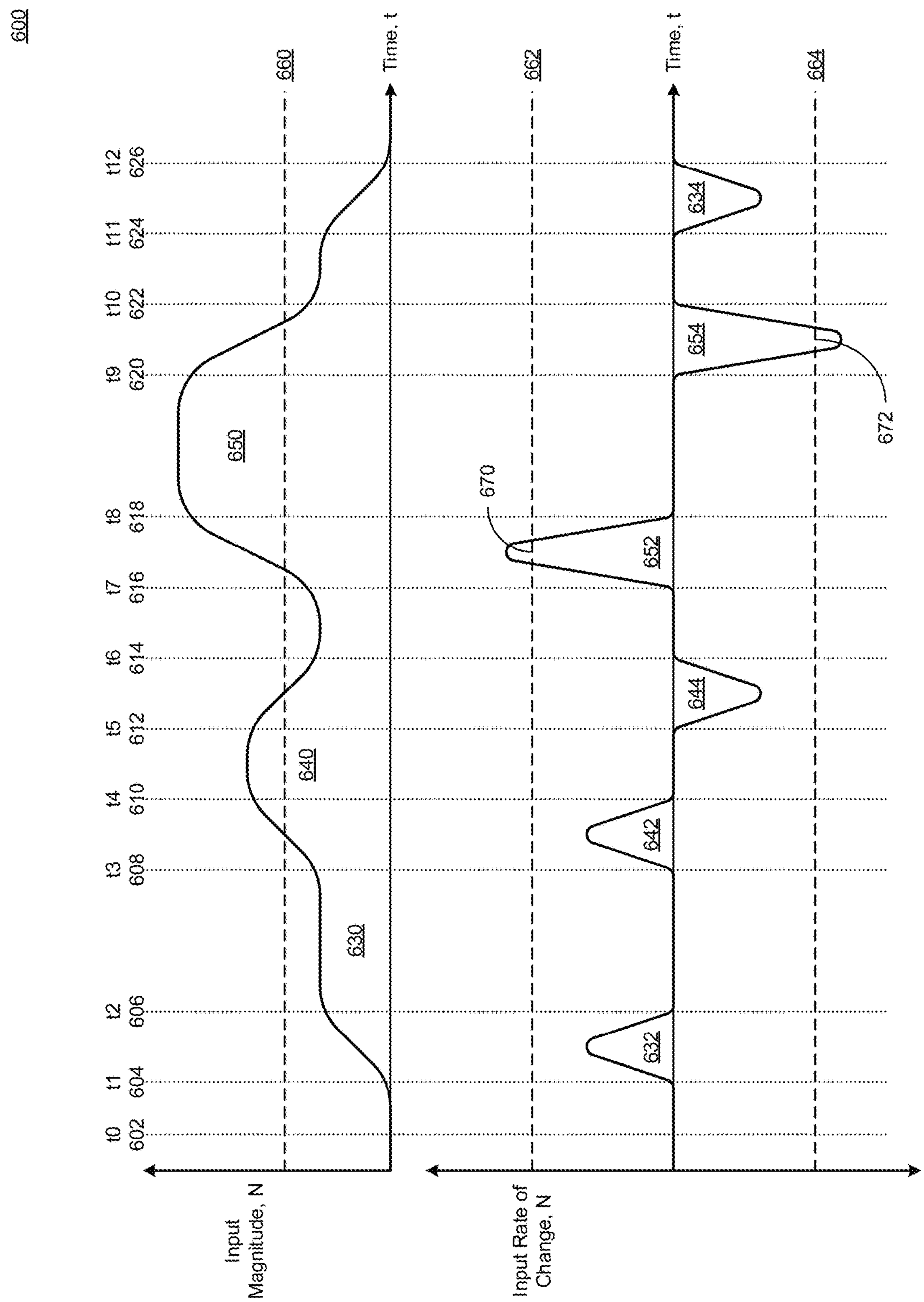
FIG. 6 illustrates exemplary timing diagrams including compounding interferences and compounding proximity input detection with interference.

FIGS. 4-6 illustrate exemplary timing diagrams according to exemplary embodiments 3A-F, including exemplary changes to detected proximity input magnitude and detected proximity input rate of change over time. FIG. 406 illustrate exemplary proximity input magnitude and rate of change in the course of exemplar operation embodiments in accordance with the exemplary systems 100 and 200.

FIG. 4 illustrates exemplary timing diagrams including isolated interference and isolated proximity input detection. At time t0 402, an exemplary system is in an initial state where both input magnitude and input rate of change are zero in the absence of detectable proximity input and the absence of detectable rate of change input. At time t1 404, an exemplary system begins receiving changing electrostatic interference, including an increasing interference magnitude 430 and a positive interference rate of change 432. Peak magnitude of the positive interference rate of change 432 does not satisfy an exemplary positive proximity input rate of change threshold 462. In some embodiments, electromagnetic interference may be caused by movement of water through a faucet not caused by a change between an "on" state and an "off" state thereof. As one example, a water faucet may receive residual or runoff water from another device or location, causing electrostatic interference. At time t2 406, an exemplary system stops receiving changing electrostatic interference and receives static electrostatic interference. As one example, at time t2 406, a water faucet may include a fixed amount of still water. Peak magnitude of the electrostatic interference 430 does not exceed an exemplary proximity input magnitude level 460. At time t3 408, an exemplary system again begins receiving changing electrostatic interference, including a decreasing interference magnitude 430 and a negative interference rate of change 434. As one example, a water faucet may drain residual or runoff water to another device or location, causing decreasing electrostatic interference with an electrostatic characteristic approaching that of an empty water faucet. Peak magnitude of the negative interference rate of change 434 does not satisfy an exemplary negative proximity input rate of change threshold 464. At time t4 410, an exemplary system is again in a state where both input magnitude and input rate of change are zero in the absence of detectable proximity input and the absence of detectable rate of change input.

At time t5 412, an exemplary system begins receiving changing proximity input, including an increasing interference magnitude 440 and a positive interference rate of change 442. Peak magnitude 470 of the positive interference rate of change 442 satisfies the exemplary positive proximity input rate of change threshold 462. At time t6 414, an exemplary system stops receiving changing proximity input and receives static electrostatic interference. As one example, at time t6 414, a hand may be located at a fixed location proximate to a water faucet. Peak magnitude of the electrostatic interference 440 exceeds an exemplary proximity input magnitude level 460. At time t7 416, an exemplary system again begins receiving changing proximity input, including a decreasing interference magnitude 440 and a negative interference rate of change 444. As one example, a hand may be proximate to and moving away from a water faucet. Peak magnitude 472 of the negative interference rate of change 444 satisfies the exemplary negative proximity input rate of change threshold 464. At time t8 418, an exemplary system is again in a state where both input magnitude and input rate of change are zero in the absence of detectable proximity input and the absence of detectable rate of change input. At time t8 420, an exemplary system again begins receiving changing electromagnetic interference, including an increasing interference magnitude 450 and a positive interference rate of change 452. At time t9 422, an exemplary system again stops receiving changing electrostatic interference and receives static electrostatic interference.

FIG. 5 illustrates exemplary timing diagrams including compounding interferences and isolated proximity input detection. At time t0 502, an exemplary system is in an initial state where both input magnitude and input rate of change are zero in the absence of detectable proximity input and the absence of detectable rate of change input. At time t1 504, an exemplary system begins receiving changing electrostatic interference, including an increasing interference magnitude 530 and a positive interference rate of change 532. Peak magnitude of the positive interference rate of change 532 does not satisfy an exemplary positive proximity input rate of change threshold 562. At time t2 506, an exemplary system stops receiving changing electrostatic interference and receives static electrostatic interference. Peak magnitude of the electrostatic interference 530 does not exceed an exemplary proximity input magnitude level 560.

At time t3 508, an exemplary system again begins receiving changing electrostatic interference, including a compounding increasing interference magnitude 540 and a compounding positive interference rate of change 542. In some embodiments, a compounding increasing interference may include an additional amount of residual or runoff water received from another device or location. At time t4 508, an exemplary system stops receiving changing electrostatic interference and receives static electrostatic interference. Peak magnitude of the compounded electrostatic interference 540 now exceeds the exemplary proximity input magnitude level 560. However, neither of the positive interference rate of change magnitudes 532 or 542 satisfy the exemplary positive proximity input rate of change threshold 562.

At time t5 512, an exemplary system again begins receiving changing electrostatic interference, including a decreasing compounded interference magnitude 540 and a negative interference rate of change 544. Peak magnitude of the negative interference rate of change 544 does not satisfy an exemplary negative proximity input rate of change threshold 564. At time t6 514, an exemplary system stops receiving changing electrostatic interference and receives static electrostatic interference. Peak magnitude of the compounded electrostatic interference 540 now does not exceed the exemplary proximity input magnitude level 560. At time t7 518, an exemplary system again begins receiving changing electrostatic interference, including a further decreasing interference magnitude 530 and a negative interference rate of change 534. Peak magnitude of the negative interference rate of change 534 does not satisfy the exemplary negative proximity input rate of change threshold 564. At time t8 518, an exemplary system is again in a state where both input magnitude and input rate of change are zero in the absence of detectable proximity input and the absence of detectable rate of change input.

At time t9 520, an exemplary system begins receiving changing proximity input, including an increasing interference magnitude 550 and a positive interference rate of change 552. Peak magnitude 570 of the positive interference rate of change 552 satisfies the exemplary positive proximity input rate of change threshold 562. At time t10 522, an exemplary system stops receiving changing proximity input and receives static electrostatic interference. Peak magnitude of the electrostatic interference 550 exceeds an exemplary proximity input magnitude level 560. At time t11 524, an exemplary system again begins receiving changing proximity input, including a decreasing interference magnitude 550 and a negative interference rate of change 554. Peak magnitude 572 of the negative interference rate of change 554 satisfies the exemplary negative proximity input rate of change threshold 564. At time t12 526, an exemplary system is again in a state where both input magnitude and input rate of change are zero in the absence of detectable proximity input and the absence of detectable rate of change input. This way, an exemplary system is operable to detect and respond to a proximity input 550 in accordance with rate of change thresholds 562 and 564, without also incorrectly responding to compounding interference 540 exceeding magnitude level 560.

FIG. 6 illustrates exemplary timing diagrams including compounding interferences and compounding proximity input detection with interference. At time t0 602, an exemplary system is in an initial state where both input magnitude and input rate of change are zero in the absence of detectable proximity input and the absence of detectable rate of change input. At time t1 604, an exemplary system begins receiving changing electrostatic interference, including an increasing interference magnitude 630 and a positive interference rate of change 632. Peak magnitude of the positive interference rate of change 632 does not satisfy an exemplary positive proximity input rate of change threshold 662. At time t2 606, an exemplary system stops receiving changing electrostatic interference and receives static electrostatic interference. Peak magnitude of the electrostatic interference 630 does not exceed an exemplary proximity input magnitude level 660.

At time t3 608, an exemplary system again begins receiving changing electrostatic interference, including a compounding increasing interference magnitude 640 and a compounding positive interference rate of change 642. At time t4 610, an exemplary system stops receiving changing electrostatic interference and receives static electrostatic interference. Peak magnitude of the compounded electrostatic interference 640 now exceeds the exemplary proximity input magnitude level 660. However, neither of the positive interference rate of change magnitudes 632 or 642 satisfy the exemplary positive proximity input rate of change threshold 662. At time t5 612, an exemplary system again begins receiving changing electrostatic interference, including a decreasing compounded interference magnitude 640 and a negative interference rate of change 644. Peak magnitude of the negative interference rate of change 644 does not satisfy an exemplary negative proximity input rate of change threshold 664. At time t6 614, an exemplary system stops receiving changing electrostatic interference and receives static electrostatic interference. Peak magnitude of the electrostatic interference 630 now does not exceed the exemplary proximity input magnitude level 660.

In some embodiments, interference 630 represents running water or like fluid through a water faucet, and proximity input 650 represents a hand moving toward or away from the water faucet while water flows therethrough. At time t7 616, an exemplary system begins receiving changing proximity input, including an increasing compounding interference magnitude 650 and a positive interference rate of change 652. Peak magnitude 670 of the positive interference rate of change 652 satisfies the exemplary positive proximity input rate of change threshold 662. At time t8 618, an exemplary system stops receiving changing proximity input and receives static electrostatic interference. Peak magnitude of the compounded electrostatic interference 650 exceeds an exemplary proximity input magnitude level 660. At time t9 620, an exemplary system again begins receiving changing proximity input, including a decreasing compounded interference magnitude 650 and a negative interference rate of change 654. Peak magnitude 672 of the negative interference rate of change 654 satisfies the exemplary negative proximity input rate of change threshold 664. At time t10 622, an exemplary system is again in a state where input magnitude 630 in the absence of detectable proximity input but in the presence of detectable electrostatic interference. As with the exemplary system operation of FIG. 5, an exemplary system is operable to detect and respond to a proximity input 650 in accordance with rate of change thresholds 652 and 654, without also incorrectly responding to compounding interference 640 exceeding magnitude level 660.

In some embodiments, a period between times t10 622 and t11 624 represents an exemplary debouncing time delay between receiving a valid proximity input, for actuating an operation mechanism of an object chassis, and actuating the operation mechanism of the object chassis, to stop or reduce flow of water through the water faucet. At time t11 624, an exemplary system again begins receiving changing electrostatic interference, including a decreasing interference magnitude 630 and a negative interference rate of change 634. Peak magnitude of the negative interference rate of change 634 does not satisfy the exemplary negative proximity input rate of change threshold 664. At time t12 626, an exemplary system is again in a state where both input magnitude and input rate of change are zero in the absence of detectable proximity input and the absence of detectable rate of change input.

Figure 7:
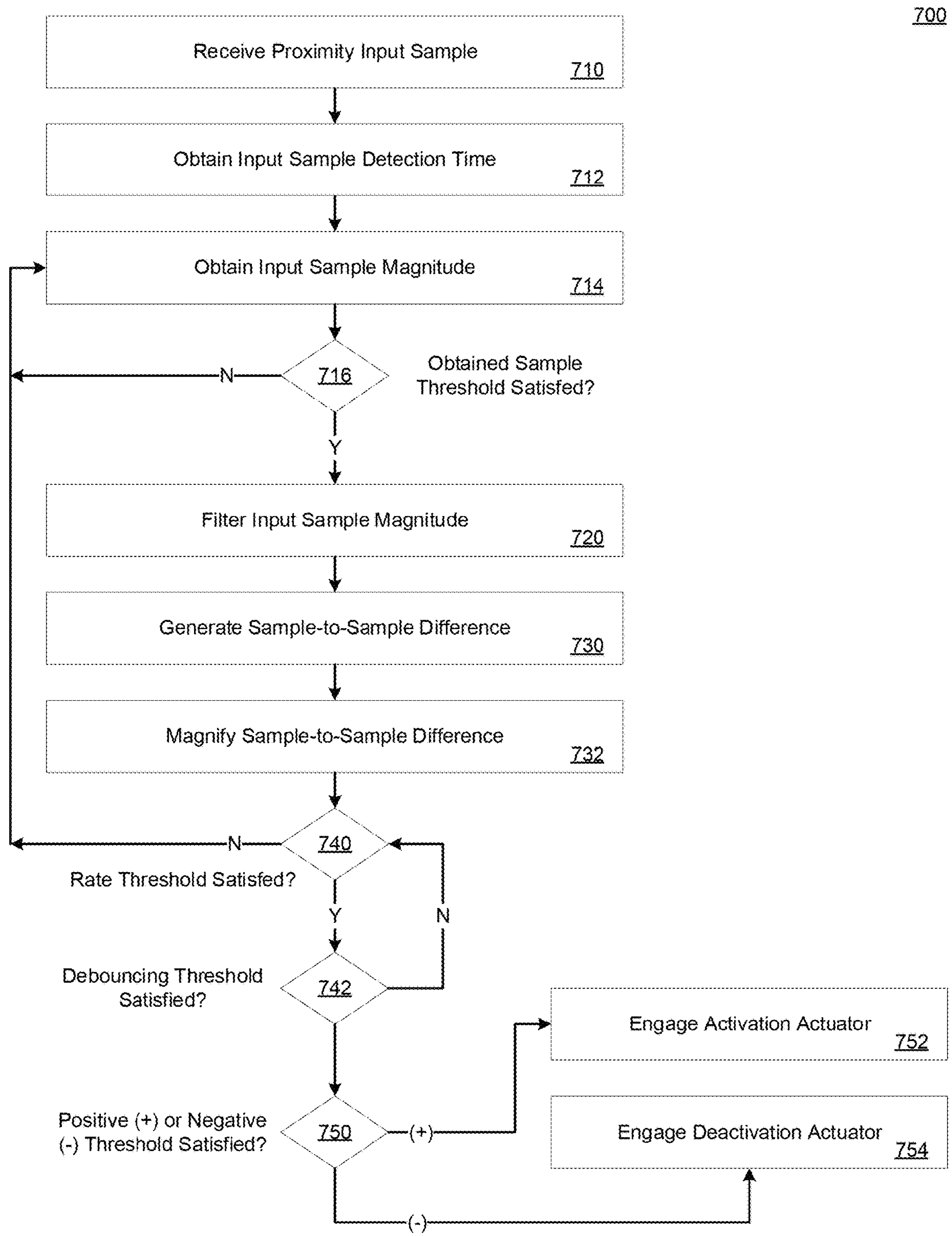
FIG. 7 illustrates an exemplary method of engaging actuation based on rate of change of proximity input.

FIG. 7 illustrates an exemplary method of engaging actuation based on rate of change of proximity input. In some embodiments, the exemplary system 100 or the device 200 performs method 700 according to present embodiments.

At step 710, the exemplary system receives a proximity input sample. In some embodiments, a proximity input sample comprises direct contact of a human hand, finger, appendage, limb, or the like, with an object chassis. In some embodiments, a proximity input sample comprises direct contact of a covered human hand, finger, appendage, limb, or the like, with an object chassis. In some embodiments, a proximity input sample comprises contactless close proximity of a predetermined distance from a human hand, finger, appendage, limb, or the like, with an object chassis. In some embodiments, predetermined distance is a function of strength of an electrostatic field or a rate of change thereof. In some embodiments, control sensor 220 performs step 710. The method 700 then continues to step 712.

At step 712, the exemplary system obtains an input sample detection time. In some embodiments, the control sensor 220 performs step 712. The method 700 then continues to step 714. At step 714, the exemplary system obtains an input sample magnitude. In some embodiments, an input sample magnitude may be positive or negative. In some embodiments, the control sensor 220 performs step 714. The method 700 then continues to step 716.

At step 716, the exemplary system determines whether an obtained sample threshold is satisfied. In some embodiments, an obtained sample threshold comprises a minimum number of samples collected without respect to time, or a minimum number of samples collected within a predetermined time period. If the exemplary system determines that the obtained sample threshold is satisfied, the method 700 continues to step 720. Alternatively, if the exemplary system determines that the obtained sample threshold is not satisfied, the method continues to step 714. In some embodiments, the input counter 232 performs step 710.

At step 720, the exemplary system filters the obtained input sample magnitude. In some embodiments, input filter 234 performs step 720. The method 700 then continues to step 730. At step 730, the exemplary system generates a sample-to-sample difference. In some embodiments, a sample-to-sample difference comprises a difference in magnitude between two sequential or non-sequential samples. In some embodiments, the rate engine 258 performs step 720. The method 700 then continues to step 732. At step 732, the exemplary system magnifies a sample-to-sample difference. In some embodiments, the input magnifier 256 performs step 720. The method 700 then continues to step 740.

At step 740, the exemplary system determines whether a rate threshold is satisfied. If the exemplary system determines that the rate threshold is satisfied, the method 700 continues to step 742. In some embodiments, one or more independent rate threshold may be used, and may be independent of or dependent on other environmental or predetermined factors in various applications. Alternatively, if the exemplary system determines that the obtained sample threshold is not satisfied, the method continues to step 714. In some embodiments, the threshold detector 254 performs step 740.

At step 742, the exemplary system determines whether a debouncing threshold is satisfied. In some embodiments, the debouncing threshold comprises a time delay for actuation upon receipt of a valid proximity input. Thus, a debouncing threshold may reduce false actuations or rapid alternation between activation and deactivation states that may cause harm to sensors, actuators, or physical structure of an object chassis. If the exemplary system determines that the debouncing threshold is satisfied, the method 700 continues to step 750. Alternatively, if the exemplary system determines that the obtained sample threshold is not satisfied, the method continues to step 740. In some embodiments, the sensor debouncer performs step 742.

At step 750, the exemplary system determines whether a positive threshold or a negative threshold is satisfied. If the exemplary system determines that the positive threshold is satisfied, the method 700 continues to step 752. Alternatively, if the exemplary system determines that the negative threshold is satisfied, the method continues to step 754. In some embodiments, the threshold detector 254 performs step 750. At step 752, the exemplary system engages an activation actuator. Alternatively, at step 754, the exemplary system engages a deactivation actuator. It is to be understood that a single actuator may perform both activation and deactivation. It is to be further understood that actuation may alternatively and variously occur only with respect to a positive threshold, a negative threshold, or an absolute value of positive and negative thresholds. This way, a system in accordance with present embodiments is operable to ignore input in either the positive or negative direction, or to treat all input as of the same magnitude and associated with a single response.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method comprising:

obtaining an input sample detection time;

obtaining an input sample magnitude;

filtering the obtained input sample magnitude;

generating a sample-to-sample difference based on the filtered input sample magnitude; and engaging an actuator in accordance with a determination that the sample-to-sample difference satisfies a rate threshold and the input sample detection time satisfies a debouncing threshold.

2. The method of claim 1, further comprising:

detecting a proximity input sample, wherein the obtaining further comprises obtaining the input sample magnitude based on the detected proximity input sample.

3. The method of claim 2, wherein the proximity input sample comprises touch contact.

4. The method of claim 1, wherein the rate threshold comprises a magnitude of rate of change in the sample-to sample difference.

5. The method of claim 1, wherein the debouncing threshold comprises a predetermined length of time between the input sample detection time and a subsequent actuation time.

6. The method of claim 1, further comprising:

magnifying the sample-to-sample difference, wherein the activating the actuator further comprises activating the actuator in accordance with a determination that the magnified sample-to-sample difference satisfies a rate threshold.

7. The method of claim 1, wherein the filtering, generating and engaging further comprise filtering, generating, and engaging in accordance with a determination that the obtained input sample magnitude satisfies a sampling threshold.

8. The method of claim 7, wherein the sampling threshold comprises a predetermined count of obtained proximity input samples.

9. The method of claim 1, wherein the rate threshold comprises a positive rate threshold, the actuator comprises an activation actuator, and the engaging further comprises engaging the activation actuator in accordance with a determination that the sample-to-sample difference satisfies the positive rate threshold.

10. The method of claim 1, wherein the rate threshold comprises a negative rate threshold, the actuator comprises an activation actuator, and the engaging further comprises engaging the deactivation actuator in accordance with a determination that the sample-to-sample difference satisfies the negative rate threshold.

11. A device comprising:

a processor;

a threshold detector operable to obtain an input sample detection time;

a control sensor operatively coupled to the processor and operable to obtain an input sample magnitude;

an input filter operatively coupled to the processor and operable to filter the at least one obtained input magnitude sample;

a non-transitory computer-readable medium operatively coupled to the processor and including a rate engine operable to generate a sample-to-sample difference based on the filtered input sample magnitude, and to generate a determination that the sample-to-sample difference satisfies a rate threshold; and a control actuator operatively coupled to the processor and operable to engage an operation mechanism in accordance with the determination that the sample-to-sample difference satisfies a rate threshold and the input sample detection time satisfies a debouncing threshold.

12. The device of claim 11, wherein the control sensor is further operable to detect a proximity input sample, and further operable to obtain the input sample magnitude in response to detecting the proximity input sample.

13. The device of claim 12, wherein the proximity input sample comprises touch contact with an object chassis coupled to the control sensor.

14. The device of claim 11, wherein the rate threshold comprises a magnitude of rate of change in the sample-to sample difference.

15. The device of claim 11, wherein the debouncing threshold comprises a predetermined length of time between the input sample detection time and a subsequent actuation time.

16. The device of claim 11, wherein the non-transitory computer-readable medium further comprises an input magnifier operable to magnify the sample-to-sample difference, and the control actuator is further operable to engage the actuator in accordance with a determination that the magnified sample-to-sample difference satisfies the rate threshold.

17. The device of claim 11, further comprising:

an input counter operatively coupled to the control sensor and operable to determine that the obtained input sample magnitude satisfies a sampling threshold, wherein the input filter, the rate engine, and the control actuator are further operable to respectively filter, generate, and engage in accordance with the determination that the obtained input sample magnitude satisfies the sampling threshold.

18. A system comprising:

a processor;

a control sensor operatively coupled to the processor and operable to obtain an input sample magnitude;

an input counter operatively coupled to the control sensor and operable to determine that the obtained input sample magnitude satisfies a sampling threshold;

an input filter operatively coupled to the processor and operable to filter the at least one obtained input magnitude sample;

a non-transitory computer-readable medium operatively coupled to the processor and including a rate engine operable to generate a sample-to-sample difference based on the filtered input sample magnitude, and to generate a determination that the sample-to-sample difference satisfies a rate threshold; and a control actuator operatively coupled to the processor and operable to engage an operation mechanism in accordance with the determination that the sample-to-sample difference satisfies a rate threshold, wherein the input filter, the rate engine, and the control actuator are further operable to respectively filter, generate, and engage in accordance with the determination that the obtained input sample magnitude satisfies the sampling threshold.

* * * * *